(12) United States Patent  
Yu et al.

(10) Patent No.: US 10,720,788 B2  
(45) Date of Patent: Jul. 21, 2020

(54) WIRELESS CHARGING DEVICES HAVING WIRELESS CHARGING COILS AND METHODS OF MANUFACTURE THEREOF

(71) Applicant: Taiwan Semiconductor Manufacturing Company, Ltd., Hsin-Chu (TW)

(72) Inventors: Chen-Hua Yu, Hsin-Chu (TW); Chita Chuang, Hsin-Chu (TW); Chen-Shien Chen, Zhubei (TW); Ming Hung Tseng, Toufen Township (TW); Sen-Kuei Hsu, Kaohsiung (TW); Yu-Feng Chen, Hsin-Chu (TW); Yen-Liang Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 331 days.

(21) Appl. No.: 14/880,047

(22) Filed: Oct. 9, 2015

(65) Prior Publication Data

US 2017/0104356 A1 Apr. 13, 2017

(51) Int. Cl.
*H02J 50/00* (2016.01)
*H02J 50/10* (2016.01)
(Continued)

(52) U.S. Cl.
CPC .......... *H02J 7/025* (2013.01); *H01F 27/2804* (2013.01); *H01F 38/14* (2013.01);
(Continued)

(58) Field of Classification Search
CPC .. H02J 7/025; H02J 7/0042; H02J 7/04; H02J 50/402; H02J 50/40; H02J 50/10;
(Continued)

(56) References Cited

U.S. PATENT DOCUMENTS 5,095,357 A * 3/1992 Andoh ................ H01F 17/0006
257/379
8,361,842 B2  1/2013 Yu et al.
(Continued)

OTHER PUBLICATIONS

"Smart Glass," Wikipedia, https://en.wikipedia.org/wiki/Smart_glass, last modified Jun. 29, 2015, downloaded Jul. 6, 2015, pp. 1-10.
(Continued)

*Primary Examiner* — Richard Isla
*Assistant Examiner* — Manuel Hernandez
(74) *Attorney, Agent, or Firm* — Slater Matsil, LLP

(57) ABSTRACT

Wireless charging devices, methods of manufacture thereof, and methods of charging electronic devices are disclosed. In some embodiments, a wireless charging device includes a controller, a molding material disposed around the controller, and an interconnect structure disposed over the molding material and coupled to the controller. The wireless charging device includes a wireless charging coil coupled to the controller. The wireless charging coil comprises a first portion disposed in the interconnect structure and a second portion disposed in the molding material. The wireless charging coil is adapted to provide an inductance to charge an electronic device.

20 Claims, 16 Drawing Sheets

(51) Int. Cl.
  *H02J 50/40* (2016.01)
  *H02J 7/02* (2016.01)
  *H01F 27/28* (2006.01)
  *H01F 41/04* (2006.01)
  *H01F 38/14* (2006.01)
  *H02J 7/00* (2006.01)
  *H02J 7/04* (2006.01)

(52) U.S. Cl.
  CPC ........... *H01F 41/04* (2013.01); *H01F 41/042* (2013.01); *H02J 7/0042* (2013.01); *H02J 7/04* (2013.01); *H02J 50/005* (2020.01); *H02J 50/10* (2016.02); *H02J 50/40* (2016.02); *H02J 50/402* (2020.01)

(58) Field of Classification Search
  CPC ....... H02J 50/005; H02J 5/005; H01F 41/042; H01F 41/04; H01F 38/14; H01F 27/2804; H01F 27/28
  USPC .......................................... 320/108; 307/104
  See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,497,646 B2* | 12/2019 | Liang | H01L 28/40 |
| 10,530,175 B2* | 1/2020 | Huang | H01F 38/14 |
| 2004/0231138 A1* | 11/2004 | Kasahara | H01F 41/041 |
| | | | 29/602.1 |
| 2010/0265024 A1* | 10/2010 | Nakashiba | H01L 23/48 |
| | | | 336/200 |
| 2010/0289126 A1* | 11/2010 | Pagaila | H01L 23/49822 |
| | | | 257/659 |
| 2011/0291288 A1 | 12/2011 | Wu et al. | |
| 2012/0098349 A1* | 4/2012 | Kim | H04B 5/0037 |
| | | | 307/104 |
| 2013/0002042 A1* | 1/2013 | Hatase | H01F 27/2871 |
| | | | 307/104 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0074321 A1* | 3/2013 | Yoon | H01F 41/041 |
| | | | 29/602.1 |
| 2013/0099730 A1* | 4/2013 | Yoon | H05K 1/165 |
| | | | 320/108 |
| 2013/0168848 A1 | 7/2013 | Lin et al. | |
| 2013/0307140 A1 | 11/2013 | Huang et al. | |
| 2014/0076617 A1 | 3/2014 | Chen et al. | |
| 2014/0203429 A1 | 7/2014 | Yu et al. | |
| 2014/0210099 A1* | 7/2014 | Hu | H01L 24/19 |
| | | | 257/774 |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0171013 A1* | 6/2015 | Liao | H01L 23/3114 |
| | | | 257/691 |
| 2019/0066907 A1* | 2/2019 | Schwersenz | H01F 27/306 |
| 2019/0088413 A1* | 3/2019 | Kawaguchi | H01F 17/0013 |

OTHER PUBLICATIONS

"Inductive Charging," Wikipedia, https://en.wikipedia.org/wiki/Inductive_charging, last modified Jul. 6, 2015, pp. 1-6.

"Resonant Inductive Coupling", Wikipedia, https://en.wikipedia.org/wiki/Resonant_inductive_couplings, last modified Jul. 16, 2015, downloaded Jul. 21, 2015, pp. 1-9.

\* cited by examiner

WIRELESS CHARGING DEVICES HAVING WIRELESS CHARGING COILS AND METHODS OF MANUFACTURE THEREOF

BACKGROUND

Wireless charging is a technology in which an electromagnetic field is used to transfer energy between two objects. The transfer of the energy using the electromagnetic field is usually accomplished with a charging station. The energy is transferred through an inductive coupling with an electronic device. The electronic device can then use that energy to charge batteries of the electronic device or run the electronic device.

A wireless charger for wireless charging includes a coil, and an electronic device to be charged includes a coil. When placed in close proximity to one another, the two coils effectively function as an electrical transformer. A current flowing through the wireless charger coil induces a current flow through the coil of the electronic device, thus providing a voltage for the electronic device that can be used to charge or re-charge the electronic device.

Wireless charges may be used in a variety of applications. One example is an electronic toothbrush, which is placed on wireless charging station to be recharged. As electronic devices continue to be reduced in size and with the recent trend towards handheld and wearable electronic devices, more applications for wireless charging are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
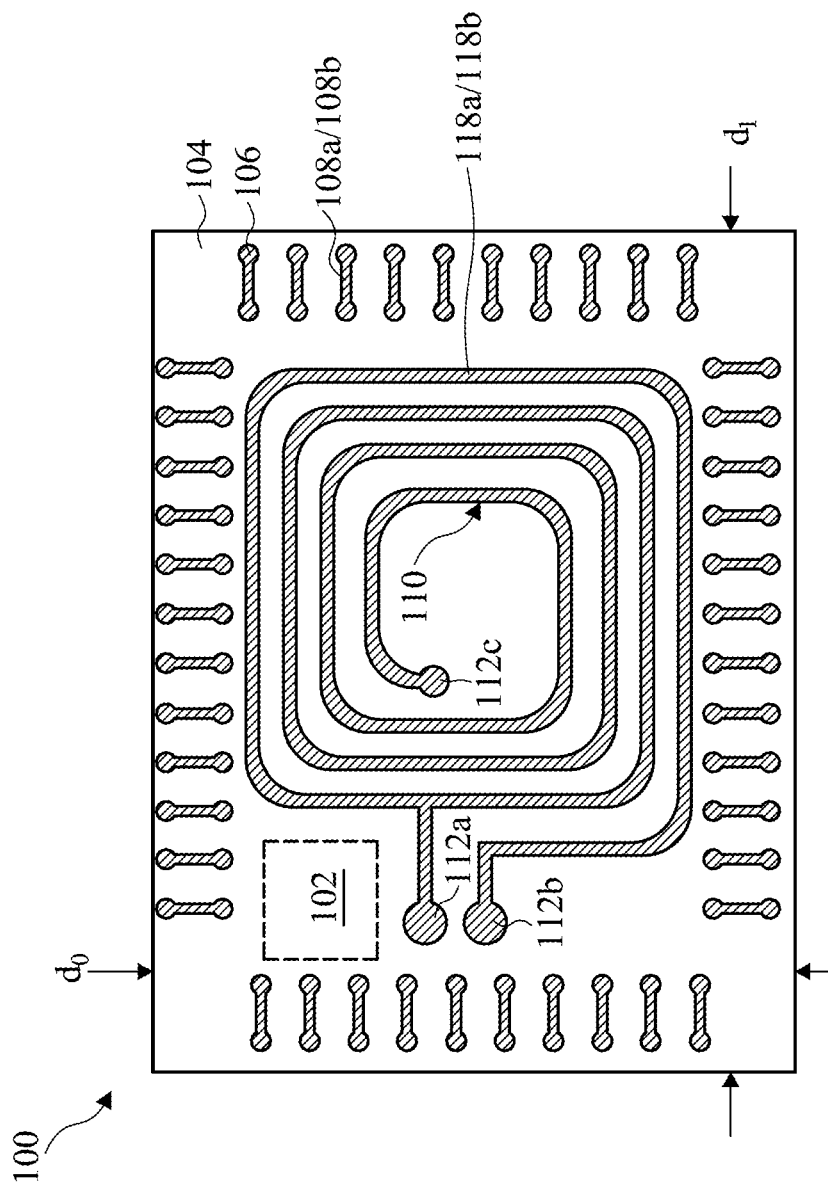
FIG. 1 is a top view that illustrates a wireless charging device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wireless charging devices, methods of manufacture thereof, and methods of charging electronic devices are disclosed in the present disclosure. Portions of wireless charging coils are formed in a molding material and a material layer of one or more interconnect structures. The wireless charging devices are adapted to provide an inductance to charge an electronic device using inductive charging and/or resonance charging. The wireless charging devices are manufactured using integrated fan-out (InFO) device technology or wafer level package (WLP) device technology in some embodiments. Throughout the various views and illustrative embodiments, like reference numerals are used to designate like elements.

Structural designs and various elements and features of wireless charging devices 100 in accordance with some embodiments will first be described generally with reference to FIGS. 1 through 7, and charging methods using the wireless charging devices 100 in accordance with some embodiments will be described with reference to FIGS. 8 and 9. Some exemplary manufacturing methods and steps, materials, elements, and features of the wireless charging devices 100 in accordance with some embodiments will be described in more detail herein with reference to FIGS. 10 through 28.

Figure 2:
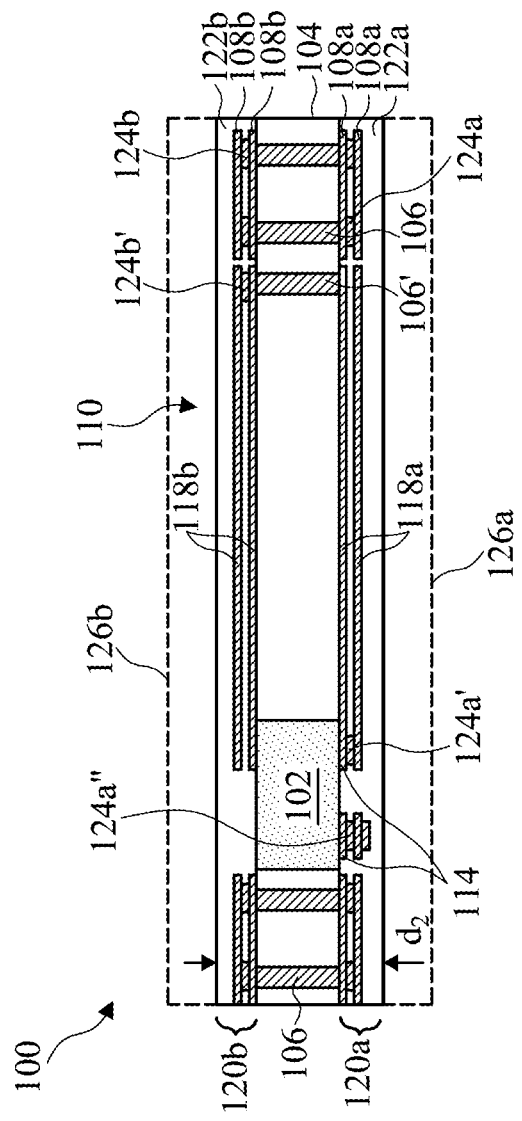
FIG. 2 is a cross-sectional view that shows of a portion of the wireless charging device shown in FIG. 1 in accordance with some embodiments.

Referring first to FIGS. 1 and 2, FIG. 1 is a top view of a wireless charging device 100 in accordance with some embodiments of the present disclosure, and FIG. 2 is a cross-sectional view illustrating a portion of the wireless charging device 100 shown in FIG. 1 in accordance with some embodiments. The wireless charging device 100 comprises a controller 102 and a molding material 104 disposed around the controller 102. Through-vias 106 are also formed in the molding material 104 in some embodiments. The wireless charging device 100 includes an interconnect structure 120a disposed over the molding material 104 and the controller 102 (e.g., beneath the molding material 104 and the controller 102 in the view shown in FIG. 2). The interconnect structure 120a includes fan-out wiring and may comprise a redistribution layer (RDL) or post-passivation interconnect (PPI) in some embodiments, for example.

The wireless charging device 100 includes a wireless charging coil 110 coupled to the controller 102. The wireless charging coil 110 is adapted to transfer an electromagnetic field to electricity in some embodiments, for example. The wireless charging coil 110 comprises a first portion disposed in the interconnect structure 120a and a second portion disposed in the molding material 104. In some embodiments shown in FIGS. 1 and 2, the first portion of the wireless charging coil 110 disposed in the interconnect structure 120a comprises a winding 118a comprising a shape of a rectangular spiral pattern formed in a conductive material layer of the interconnect structure 120a, and the second portion of the wireless charging coil 110 disposed in the molding material 104 comprises a through-via 106'. The through-via 106' is coupled to the first portion of the wireless charging coil 110 comprising the winding 118a (i.e., the top winding 118a in FIG. 2). The top winding 118a is coupled to the top of the through-via 106', for example. The wireless charging coil 110 of the wireless charging device 100 is adapted to provide an inductance to charge an electronic device (not shown in FIGS. 1 and 2; see electronic device 180 shown in FIGS. 8 and 9).

Referring again to FIGS. 1 and 2, in some embodiments, the interconnect structure 120a comprises a first interconnect structure 120a, and the wireless charging device 100 also includes a second interconnect structure 120b. The first interconnect structure 120a is disposed over a first side (i.e., the bottom side in FIG. 2) of the molding material 104 and the controller 102, and the second interconnect structure 120b is disposed over a second side (i.e., the top side in FIG. 2) of the molding material 104 and the controller 102, the second side being opposite the first side. The wireless charging coil 110 further comprises a third portion disposed in the second interconnect structure 120b. The third portion of the wireless charging coil 110 disposed in the second interconnect structure 120b comprises a winding 118b comprising a shape of a rectangular spiral pattern formed in a conductive material layer of the second interconnect structure 120b. The winding 118b (i.e., the bottom winding in FIG. 2) is coupled to the second portion of the wireless charging coil 110 in the molding material 104 which comprises the through-via 106'. The bottom winding 118b is coupled to the top of the through-via 106', for example.

In some embodiments, only one interconnect structure is included in the wireless charging device 100. The wireless charging device 100 includes a first interconnect structure 120a or a second interconnect structure 120b in some embodiments, for example.

The first interconnect structure 120a and/or the second interconnect structure 120b may include one or more windings 118a and/or 118b formed therein. In some embodiments, the windings 118a and/or 118b are symmetric. For example, each of the windings 118a and/or 118b in the various material layers of the first interconnect structure 120a and/or the second interconnect structure 120b is aligned with overlying or underlying windings 118a and/or 118b in the various material layers of the first interconnect structure 120a and the second interconnect structure 120b. The windings 118a and/or 118b may comprise substantially the same size and shape, for example. In some embodiments, the windings 118a and/or 118b may be asymmetric, may not overlay one another, and may comprise different sizes and shapes, not shown.

The first interconnect structure 120a and the second interconnect structure 120b may include one or more conductive material layers. For example, in FIG. 2, the first interconnect structure 122 comprises an insulating material 122a, and a plurality of conductive features are formed in the insulating material 122a. The insulating material 122a comprises a plurality of insulating material layers in some embodiments. The first interconnect structure 120a includes three conductive material layers: a conductive line layer that includes the bottom winding 118a of the wireless charging coil 110 and conductive lines 108a formed therein; a via layer that includes vias 124a and 124a" and via 124' of the wireless charging coil 110, wherein the via 124' is coupled to the bottom winding 118a of the wireless charging coil 110; and a conductive line layer that includes the top winding 118a of the wireless charging coil 110 and conductive lines 108a formed therein, wherein the top winding 118a is coupled to the via 124'.

Thus, in some embodiments shown in FIGS. 1 and 2, the wireless charging coil 110 includes two windings 118a coupled together by a via 124a' in the first interconnect structure 120a, a through-via 106' disposed in the molding material 104 that is coupled to the top winding 118a in the first interconnect structure 120a, and two windings 118b coupled together by a via 124b' in the second interconnect structure 120b, wherein the through-via 106' is coupled to the bottom winding 118b in the second interconnect structure 120b. In some embodiments, a first portion of the wireless charging coil 110 comprises a plurality of first windings 118a formed in a plurality of conductive layers of the first interconnect structure 120a, wherein adjacent ones of the plurality of first windings 118a are coupled together by a via 124a' in a via layer of the first interconnect structure 120a. In some embodiments, a third portion of the wireless charging coil 110 comprises a plurality of second windings 118b formed in a plurality of conductive layers of the second interconnect structure 120b, wherein adjacent ones of the plurality of second windings 118b are coupled together by a via 124b' in a via layer of the second interconnect structure 120b, as another example.

The wireless charging coil 110 is coupled to contact pads 114 of the controller 102. For example, in FIG. 2, the via 124a' of the first interconnect structure 120a and the top winding 118a of the wireless charging coil 110 are coupled to the right contact pad 114 of the controller 102. An opposite end or another portion of the wireless charging coil 110 is coupled to the left contact pad 114 of the controller 102 by a via 124a" of the first interconnect structure 120a. The wireless charging coil 110 may also be coupled to other components of the wireless charging device 100, such as capacitors 132, integrated passive devices (IPD's) 134, integrated circuit dies 148, inductors 150 (not shown in FIG. 1 and FIG. 2; see FIG. 5 and FIG. 7), or other components. The capacitors 132, IPD's 134, integrated circuit dies 148, inductors 150, or other components may be disposed within the molding material 104 (see FIG. 5) or coupled to the first interconnect structure 120a and/or the second interconnect structure 120b (see FIG. 7), for example. The IPD's 134 may comprise an integrated capacitor or inductor in an integrated circuit die using silicon or other semiconductor technology and materials, for example.

FIG. 1 also illustrates terminals 112a, 112b, and 112c that may be coupled to the wireless charging coil 110 in accordance with some embodiments. Terminal 112a is coupled to a portion of the wireless charging coil 110 partway along the length of wireless charging coil 110, terminal 112b is coupled to a first end of the wireless charging coil 110, and terminal 112c is coupled to a second end of the wireless charging coil 110, wherein the second end is opposite the first end. The first end and second end of the wireless charging coil 110 are coupled to the contact pads 114 of the controller 102 in some embodiments. The terminal 112a coupled to the portion of the wireless charging coil 110 partway along the length of wireless charging coil 110 may also be coupled to a contact pad 114 of the controller 102 or to other components of the wireless charging device 100, for example. In some embodiments, the terminal 112a coupled partway along the wireless charging coil 110 is not included.

FIG. 2 illustrates in phantom (e.g., in dashed lines) carriers 126a and 126b that may be used in the manufacturing process for the wireless charging device 100, which will be described further herein. Some material layers of the wireless charging device 100 may be formed over one or more carriers 126a and 126b. The carriers 126a and 126b are later removed, after various manufacturing processes for the wireless charging device 100 are completed.

The wireless charging device 100 may have a length comprising dimension $d_0$, shown in FIG. 1, wherein dimension $d_0$ comprises about 5 mm to about 40 mm in some embodiments. The wireless charging device 100 may have a width comprising dimension $d_1$, wherein dimension $d_1$ comprises about 5 mm to about 40 mm in some embodiments. The wireless charging device 100 may have a thickness comprising dimension $d_2$, shown in FIG. 2, wherein dimension $d_2$ comprises about 0.2 mm to about 2 mm or greater in some embodiments. Dimensions $d_0$, $d_1$, and $d_2$ may also comprise other values.

In some embodiments illustrated in FIGS. 1 and 2, the wireless charging device 100 includes a plurality of conductive lines 108a and 108b disposed around a perimeter of the wireless charging coil 110. The plurality of conductive lines 108a and 108b is coupled to through-vias 106 disposed in the molding material 104. For example, conductive lines 108a are each coupled to two through-vias 106, and conductive lines 108b are each coupled to two through-vias 106. In some embodiments, stacked conductive lines 108a are coupled together by vias 124a in the first interconnect structure 120a, and stacked conductive lines 108b are coupled together by vias 124b in the second interconnect structure 120b. The plurality of conductive lines 108a and 108b disposed around the perimeter of the wireless charging coil 110 may be used as one or more coil functions to enhance the charging efficiency of the wireless charging device 100 in some embodiments, for example. Ends of the conductive lines 108 may also be used as contact pads for the wireless charging device 100, for example.

Figure 3:
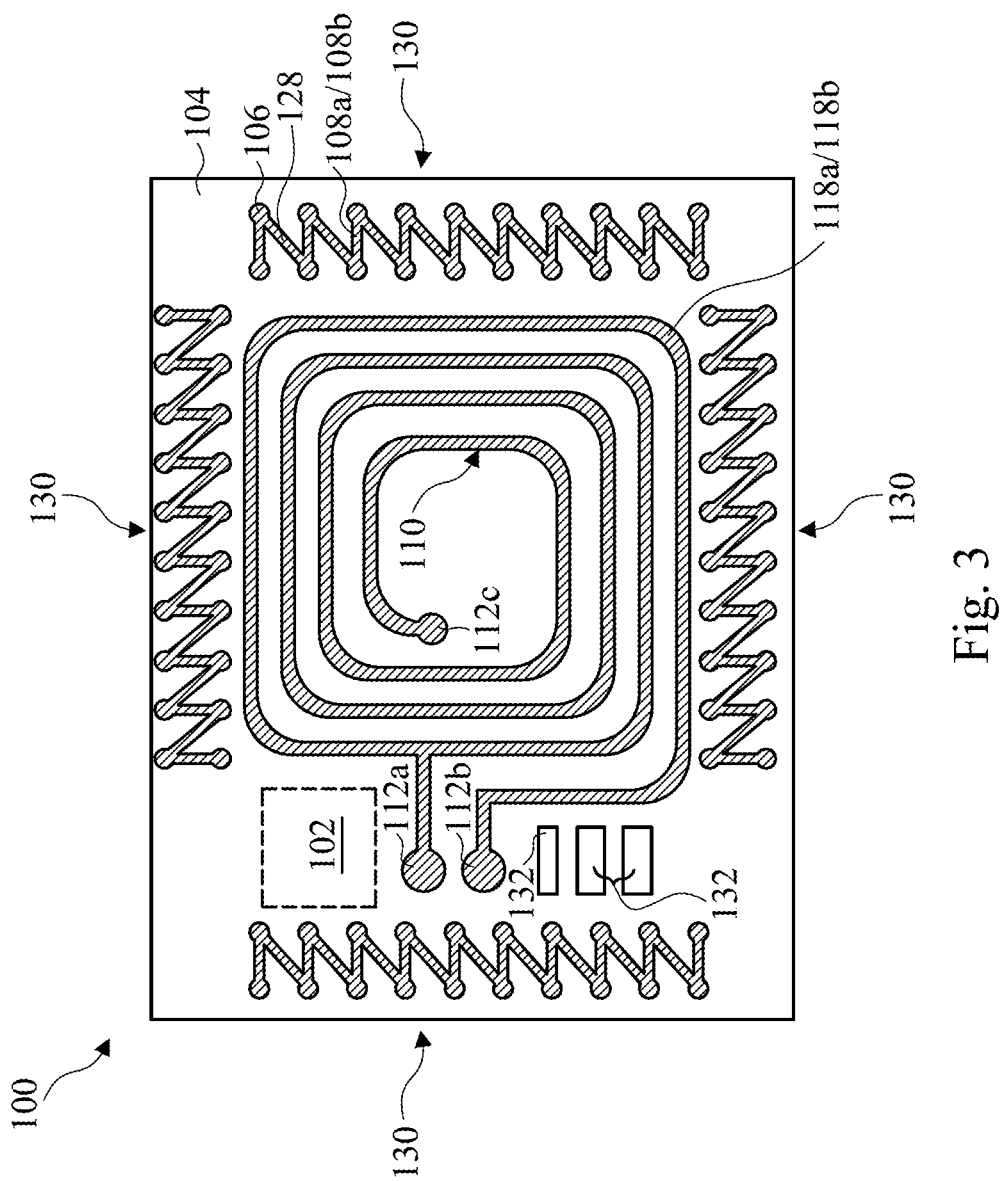
FIG. 3 is a top view showing a wireless charging device in accordance with some embodiments.

In some embodiments, the wireless charging device 100 may include a plurality of windings 130 disposed around a perimeter of the wireless charging coil 110, as illustrated in FIG. 3, which shows a top view of a wireless charging device 100 in accordance with some embodiments. One winding 130 is disposed along each side of the wireless charging device 100 in some of the embodiments shown, for example. The plurality of windings 130 include the conductive lines 108a and 108b shown in FIGS. 1 and 2, and also include diagonal conductive lines 128 coupled between adjacent stacks of conductive lines 108a/108b. The plurality of windings 130 is also coupled to through-vias 106 disposed in the molding material 104, as described for the previous embodiments. The diagonal conductive lines 128 may be included in one or more conductive line layers of the first interconnect structure 120a or the second interconnect structure 120b. In some embodiments, the diagonal conductive lines 128 are included in each of the conductive line layers that have a conductive line 108a or 108b formed therein, for example. The plurality of windings 130 disposed around the perimeter of the wireless charging coil 110 may be used as inductors for the wireless charging device 100, for example. Ends or portions of the windings 130 may also be used as contact pads for the wireless charging device 100, for example.

FIG. 3 also illustrates capacitors 132 that may be embedded in the wireless charging device 100 or that may be coupled to the wireless charging device 100. The capacitors 132 may comprise single capacitors, discrete capacitors, semiconductive capacitors, or multilayer ceramic chip (MLCC) capacitors, as examples. The capacitors 132 may also comprise other types of capacitors. The capacitors 132 may be disposed in the molding material 104 in some embodiments. The capacitors 132 may also be disposed on a surface of the first interconnect structure 120a, on a surface of the second interconnect structure 120b, or on a surface of both the first interconnect structure 120a and the second interconnect structure 120b. The capacitors 132 may be attached to the first interconnect structure 120a and/or the second interconnect structure 120b using an adhesive or an adhesive film, for example. The capacitors 132 may comprise a capacitance range of about 1 picofarad (pF) to about 1 microfarad (μF) in some embodiments. The capacitors 132 may also be located in other regions of the wireless charging device 100, may be formed using other methods, may comprise other types of capacitors, and may comprise other capacitance values. Capacitors 132 may be included in the wireless charging device 100 when resonant charging is used, to form a tuned LC circuit or RLC circuit in some embodiments, for example. Capacitors 132 may also be used for other functions of the wireless charging device 100.

Figure 4:
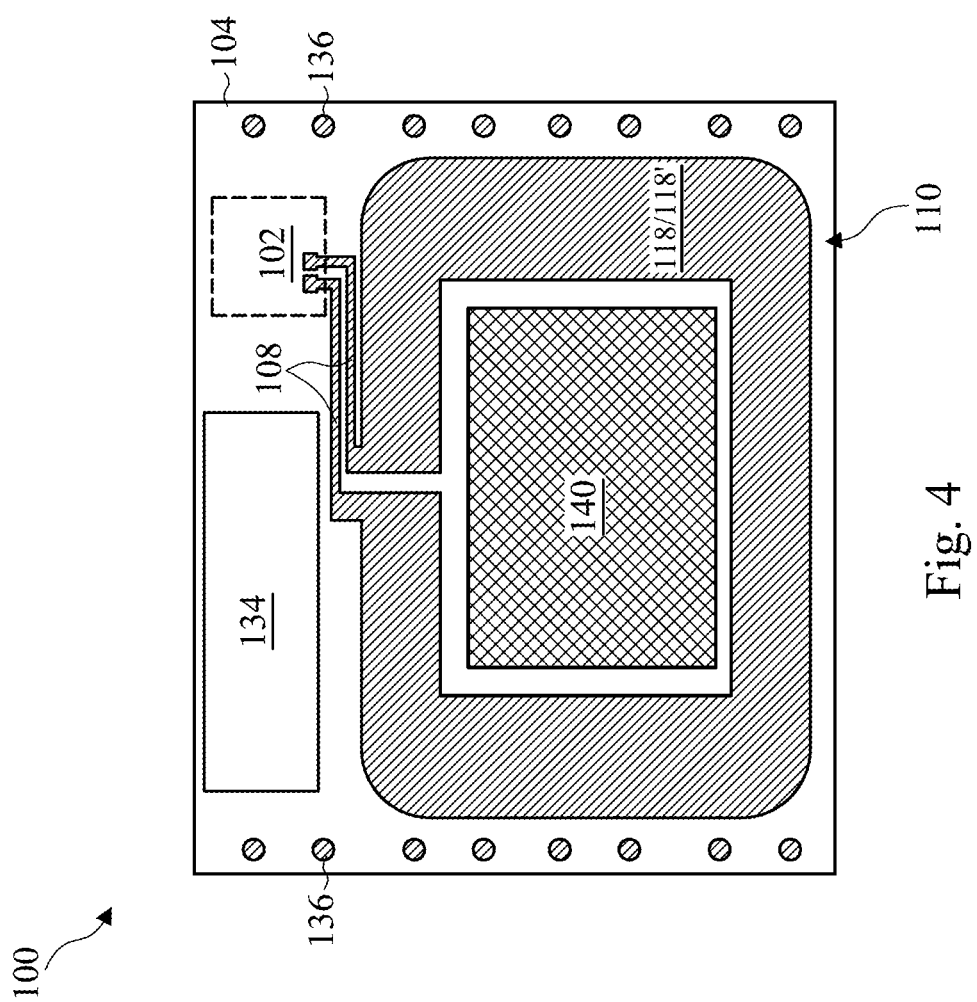
FIG. 4 is a top view that illustrates a wireless charging device in accordance with some embodiments of the present disclosure.
Figure 5:
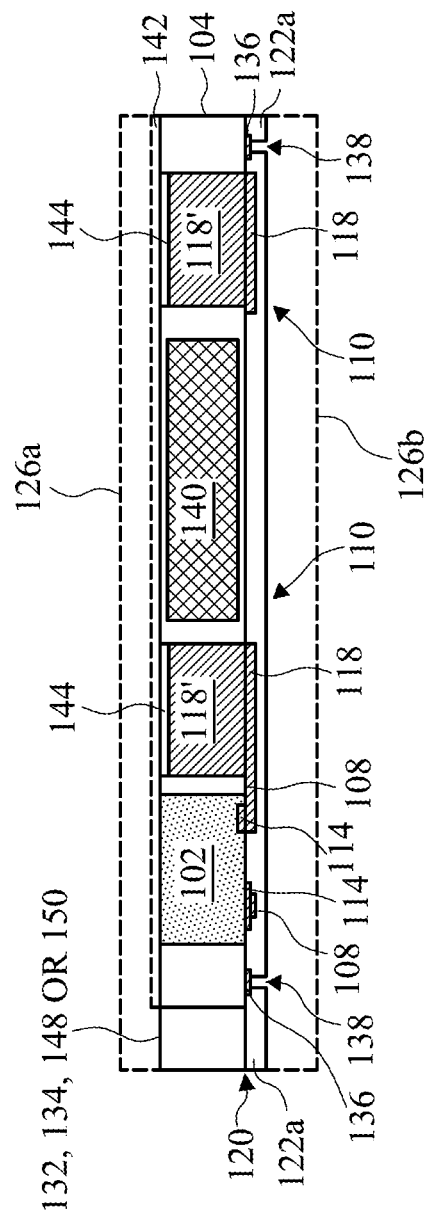
FIG. 5 is a cross-sectional view that shows of a portion of the wireless charging device shown in FIG. 4 in accordance with some embodiments.
Figure 6:
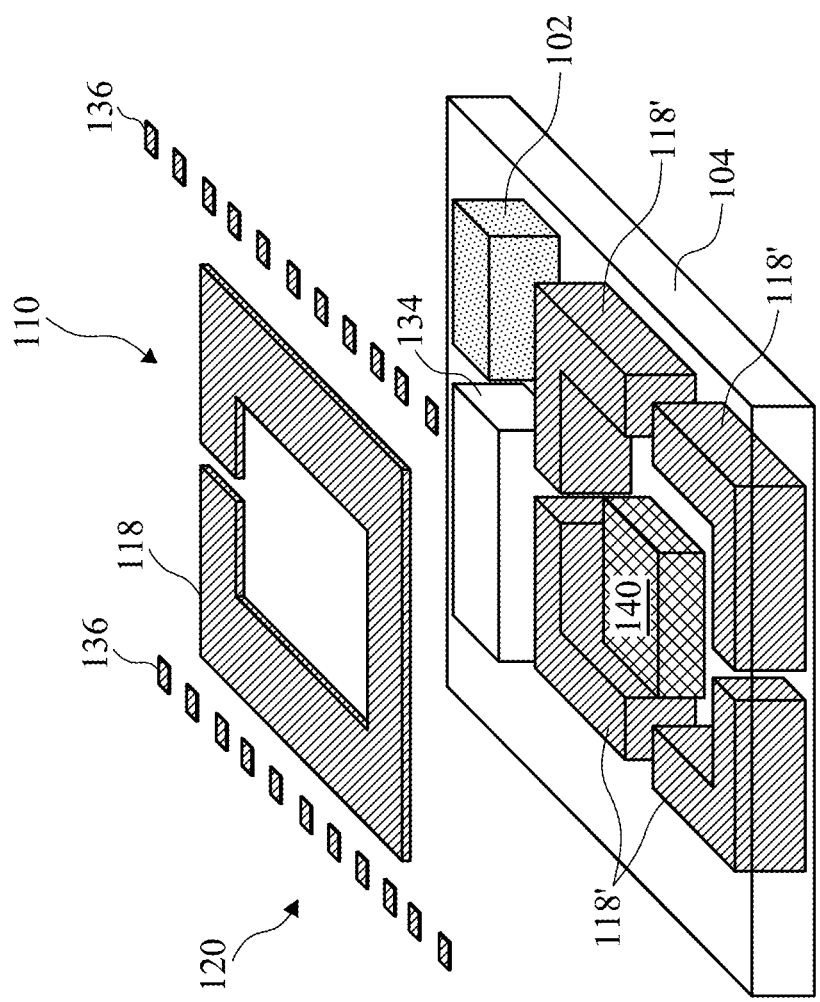
FIG. 6 is a perspective view that illustrates a portion of the wireless charging device shown in FIGS. 4 and 5 in accordance with some embodiments.

FIG. 4 is shows top view of a wireless charging device 100 in accordance with some embodiments of the present disclosure. The wireless charging coil 110 comprises a single continuous winding in some of the embodiments shown. FIG. 5 is a cross-sectional view that illustrates a portion of the wireless charging device 100 shown in FIG. 4 in accordance with some embodiments, and FIG. 6 shows a perspective view of a portion of the wireless charging device 100 shown in FIGS. 4 and 5 in accordance with some embodiments.

The wireless charging device 100 includes an IPD 134 that is embedded in the molding material 104. The wireless charging device 100 also includes a plurality of contact pads 136 disposed along two sides. The contact pads 136 may also be located in other regions of the wireless charging device 100. Openings 138 shown in FIG. 5 may be formed over the contact pads 136 so that electrical contact may be made to the contact pads 136, for example.

A glass material 140 is disposed within a central region of the wireless charging coil 110 in some embodiments. The glass material 140 may comprise a dummy glass that is adapted to improve a quality (Q) factor of the wireless charging coil 110 in some embodiments, for example. In some embodiments, the glass material 140 may comprise silicon. The glass material 140 may also comprise other materials. The glass material 140 may reduce or prevent interference in some embodiments wherein conductive lines or other conductive material is disposed proximate the wireless charging coil 110, for example.

The wireless charging device 100 includes one interconnect structure 120 in some of the embodiments shown. The wireless charging device 100 may also include a first interconnect structure 120a and a second interconnect structure 120b, as illustrated in some of the previous embodiments.

The first portion of the wireless charging coil 110 disposed within the interconnect structure 120 comprises a continuous winding having a first end and a second end, wherein the first end and the second end are coupled to the controller 102 by conductive lines 108. The first portion comprising the winding comprises one loop in some embodiments. The second portion of the wireless charging coil 110 disposed within the molding material 104 comprises a winding 118' comprising a plurality of through-via segments, as illustrated in FIGS. 5 and 6. The first portion comprising the continuous winding formed in the interconnect structure 120 is coupled to the second portion comprising the winding 118' comprising the plurality of through-via segments formed in the molding material 104.

The winding 118' comprising the plurality of through-via segments comprises a slotted design. For example, in FIG. 6, the through-via segments of the winding 118' comprise an L-shape with a space or slot between each of the through-via segments. The slotted design of the through-via segments may increase resistance and enhance a Q-factor in some embodiments, for example. In some embodiments, a space-to-width ratio of the through-via segments comprises about 2.5, as an example, which may improve Q-factors. The space-to-width ratio of the through-via segments of the winding 118' may also comprise other values.

Figure 7:
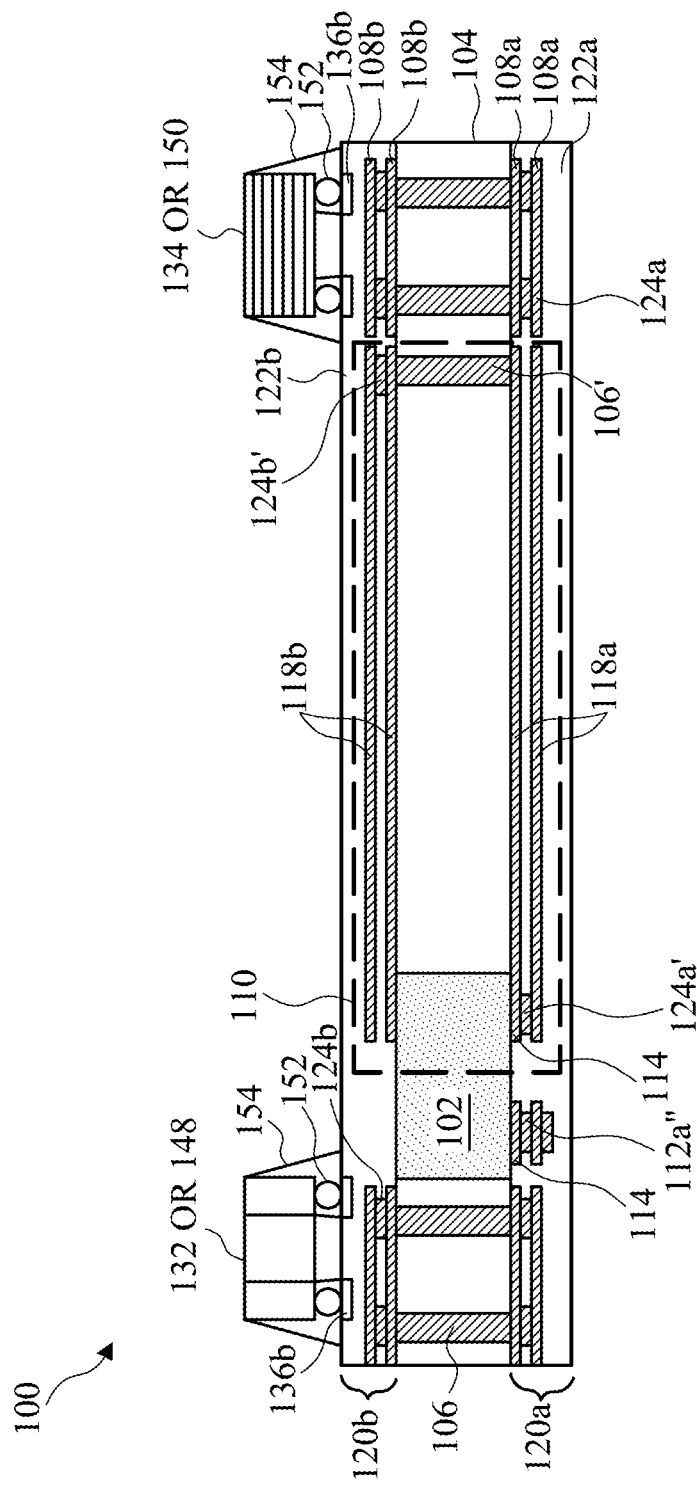
FIG. 7 is a cross-sectional view that shows a wireless charging device in accordance with some embodiments of the present disclosure.

FIG. 7 shows a cross-sectional view of a wireless charging device 100 in accordance with some embodiments of the present disclosure. The wireless charging device 100 includes a capacitor 132 or an integrated circuit die 148, and an IPD 134 or inductor 150 coupled to a surface of the second interconnect structure 120b. The capacitor 132 or integrated circuit die 148 and IPD 134 or inductor 150 are coupled to contact pads 136b of the second interconnect structure 120b by connectors 152 which may comprise solder balls, solder bumps, or other types of connectors. The capacitor 132 or integrated circuit die 148 and IPD 134 or inductor 150 may be attached to the second interconnect structure 120b, and a eutectic material of the connectors 152 may be reflowed, mechanically and electrically attaching the capacitor 132 or integrated circuit die 148 and IPD 134 or inductor 150 to the second interconnect structure 120b. An underfill material 154 may be applied to a perimeter or a side of the capacitor 132 or integrated circuit die 148 and IPD 134 or inductor 150 to encapsulate the connectors 152 in some embodiments. In some embodiments, the underfill material 154 is not included.

Figure 8:
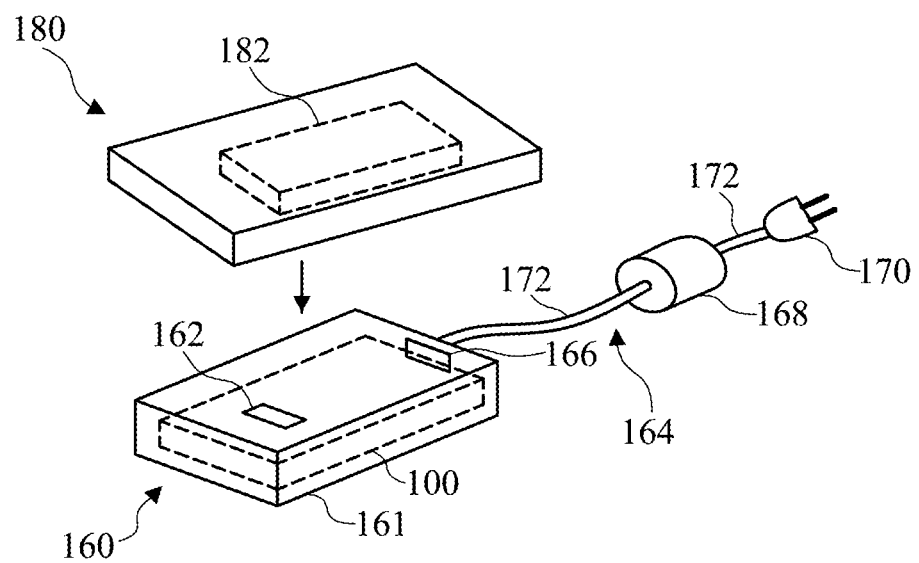
FIGS. 8 and 9 are perspective views illustrating a method of charging an electronic device using a wireless charging device in accordance with some embodiments.
Figure 9:
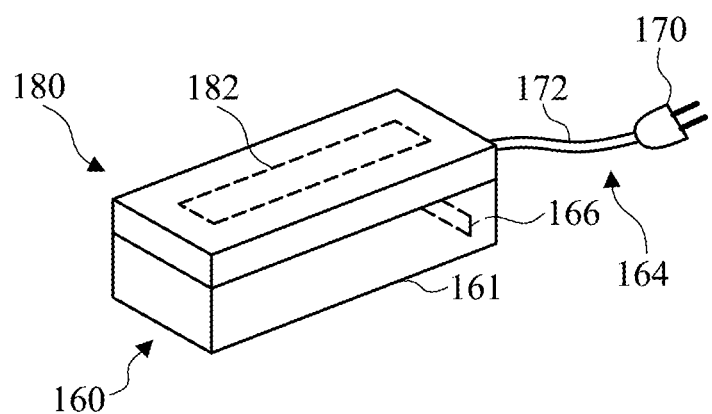

FIGS. 8 and 9 are perspective views of a method of charging an electronic device using a wireless charging device 100 in accordance with some embodiments. A packaged wireless charging device 160 includes a wireless charging device 100 described herein. Only one wireless charging device 100 is illustrated in FIGS. 8 and 9; two or more wireless charging devices 100 may be included in a single packaged wireless charging device 160 in accordance with some embodiments.

The packaged wireless charging device 160 includes a chassis 161 disposed around the wireless charging device 100. The chassis 161 comprises a material such as plastic, or other types of material that will not provide shielding or block inductance from the wireless charging coil 110, for example. The chassis 161 may include an on/off button 162 in some embodiments. In some embodiments, an on/off button 162 is not included.

A power cord 164 is coupleable to the chassis 161. The chassis 161 includes a connector 166 disposed thereon that is adapted to mate with a connector on the power cord 164. The connector 166 may comprise any suitable type of connector, and in some embodiments may comprise a universal serial bus (USB) or a mini-USB connector, as examples. Other types of connectors may also be used for the connector 166. In some embodiments, the power cord 164 may include a transformer or adapter 168 and a plug 170. The plug 170 is adapted to be plugged into an electrical socket suitable for the country the wireless charging device 100 is being used in. For example, in the United States, the plug may comprise a plug suitable to be inserted and utilized with an alternating current (A/C) 110 electrical socket or receptacle. Portions of the power cord 164 may comprise a wire 172 coupled between the connector 166 and the transformer or adapter 168 and a wire 172 coupled between the transformer or adapter 168 and the plug 170, for example. The packaged wireless charging device 160 may be adapted to operate at about 0 Watts to about 10 Watts in some embodiments, for example. Other power levels may also be used for a packaged wireless charging device 160.

An electronic device 180 to be charged is placed proximate the packaged wireless charging device 160, as shown in FIGS. 8 and 9. The electronic device 180 is placed adjacent (e.g., on top of) the packaged wireless charging device 160 in some embodiments, for example, as shown in FIG. 9. The electronic device 180 includes a coil 182 that is adapted to receive an inductance from the wireless charging coil 110 of the wireless charging device 100 in order to charge the electronic device 180. The electronic device 180 may comprise a cellular phone, a smart phone, a watch, a notebook, a tablet, a wifi device, a smart glass device, a wearable device, a smart home device, a health monitor, or other compatible electronic devices, as examples.

In some embodiments, method of manufacturing a wireless charging device 100 comprises forming a molding material 104 around a controller 102, and coupling an interconnect structure 120, 120a, and/or 120b over the molding material 104 and the controller 102. The method includes coupling a wireless charging coil 110 to the controller 102. Coupling the wireless charging coil 110 may comprise forming a first portion of the wireless charging coil 110 in the interconnect structure 120, 120a, and/or 120b and forming a second portion of the wireless charging coil 110 in the molding material 104. The wireless charging coil 110 is adapted to provide an inductance to charge an electronic device 180.

The first portion, second portion, and third portion of the wireless charging coil 110 may be formed using a metal foil stamping process or a plating process in some embodiments. The first portion, second portion, and third portion of the wireless charging coil 110 may also be formed using other methods, depending on a material used for the wireless charging coil 110. For example, the first portion, second portion, and third portion of the wireless charging coil 110 may be formed using damascene processes and/or subtractive etch processes, in some embodiments.

In some embodiments, one or more carriers 126, 126a, and/or 126b are used in the manufacturing process for a wireless charging device 100. In some embodiments, the molding material 104 and components within the molding material 104 are formed first, and the interconnect structure 120, 120a, or 120b is then formed. In other embodiments, an interconnect structure 120, 120a, or 120b is formed first, and then the molding material 104 and components within the molding material 104 are formed over the interconnect structure 120, 120a, or 120b.

For example, FIGS. 10 through 17 illustrate cross-sectional views of a method of manufacturing a wireless charging device 100 at various stages of a manufacturing process in accordance with some embodiments, wherein the molding material 104 and components within the molding material 104 are formed first, and wherein a plating process is used to form at least the through-vias 106 in the molding material 104, and in some embodiments is also used to form the second portion of the wireless charging coil 110.

Figure 10:
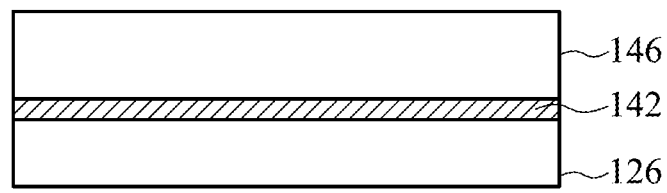
FIGS. 10 through 17 illustrate cross-sectional views of a method of manufacturing a wireless charging device at various stages of a manufacturing process in accordance with some embodiments.

In FIG. 10, a carrier 126 is provided. The carrier 126 may comprise a glass carrier substrate, a ceramic carrier substrate, a wafer such as a semiconductor wafer, or the like. The carrier 126 may include a release layer (not shown) formed thereon which may comprise a polymer-based material. The release layer may be removed along with the carrier 126 from the overlying structures that will be formed in subsequent steps. In some embodiments, the release layer may comprise an epoxy-based thermal-release material, which loses its adhesive property when heated, such as a light-to-heat-conversion (LTHC) release coating. In other embodiments, the release layer may comprise an ultra-violet (UV) glue, which loses its adhesive property when exposed to UV light. The release layer may be dispensed as a liquid and cured, and may be a laminate film laminated onto the carrier 126, or the like. An adhesive (also not shown) may be formed or dispensed over the release layer. The adhesive may comprise a die attach film (DAF), a glue, a polymer material, or the like.

A seed layer 142 is formed over the carrier 126 (e.g., over the release film and/or the adhesive disposed over the carrier 126). In some embodiments, the seed layer 142 comprises a metal layer, which may be a single layer or a composite layer comprising a plurality of sub-layers formed of different materials. In some embodiments, the seed layer comprises a titanium layer and a copper layer over the titanium layer. The seed layer may be formed using, for example, sputtering, physical vapor deposition (PVD), or the like.

Figure 11:
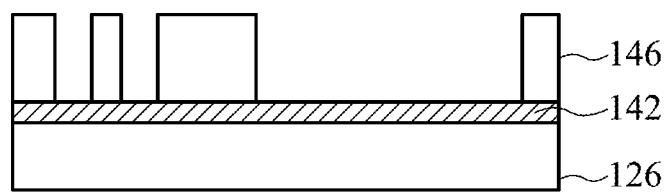

A sacrificial material 146 is then formed on the seed layer 142 and is patterned, as shown in FIGS. 10 and 11. The sacrificial material 146 may comprise a photosensitive material such as a photoresist or an insulator that is photosensitive, as examples. The sacrificial material 146 may be formed by spin coating or the like and may be patterned by exposure to light or energy reflected from or transmitted through a patterned lithography mask having a desired pattern thereon. The pattern of the sacrificial material 146 corresponds to the pattern for through-vias 106 in some embodiments. In some embodiments, the pattern of the sacrificial material 146 corresponds to the pattern for through-vias 106 and also the second portion of the wireless charging coil 110. The patterning of the sacrificial material 146 forms openings through the sacrificial material 146, leaving portions of the seed layer 142 exposed, as shown in FIG. 11.

Figure 12:
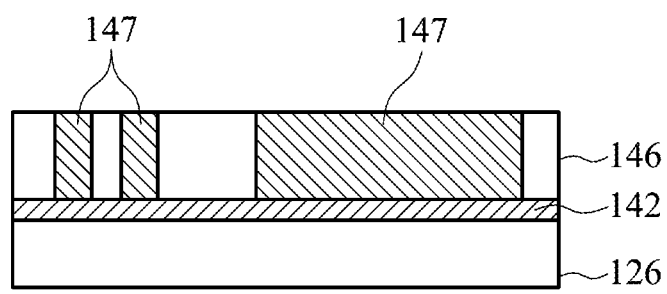

Referring next to FIG. 12, a conductive material 147 is formed in the openings of the sacrificial material 146 and on the exposed portions of the seed layer 142. The conductive material 147 may be formed by plating, such as electroplating or electroless plating, or the like. The conductive material may comprise a metal, such as copper, titanium, tungsten, aluminum, alloys or multiple layers thereof, or the like. In some embodiments, the plating process results in plating the second portion of the wireless charging coil 110 over the seed layer 142 through the patterned sacrificial material 146, for example.

Figure 13:
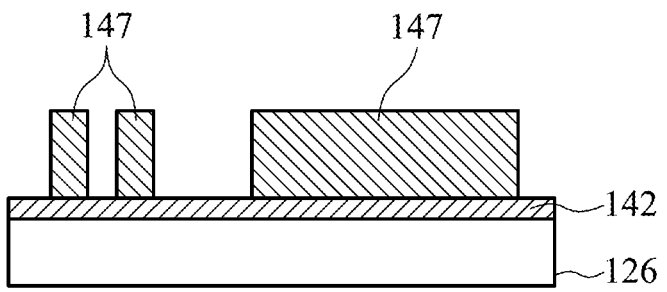
Figure 14:
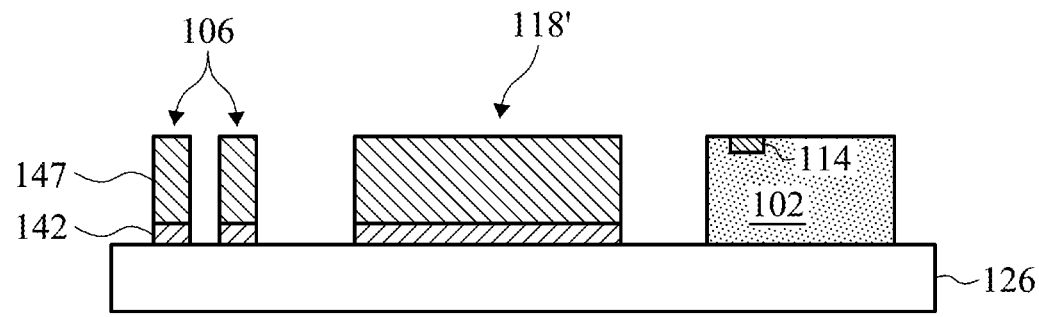

Then, the sacrificial material 146 and portions of the seed layer 142 upon which the conductive material 147 is not formed are removed, as shown in FIGS. 13 and 14. The sacrificial material 146 may be removed by an acceptable ashing or stripping process, such as using an oxygen plasma or the like. An etch process may also be used to remove the sacrificial material 146, e.g., in some embodiments wherein a photosensitive insulating material is used for the sacrificial material 146. After the sacrificial material 146 is removed as shown in FIG. 13, exposed portions of the seed layer 142 are removed, as shown in FIG. 14, such as by using an acceptable etching process, such as by wet or dry etching. The seed layer 142 that was disposed beneath the sacrificial layer 146 is removed, for example. The remaining portions of the seed layer 142 and conductive material 147 form the through-vias 106 and the winding 118' of the wireless charging coil 110.

The controller 102 is then coupled to the carrier 126, also shown in FIG. 14. The controller 102 is attached to the carrier 126 by the adhesive or release film disposed on the carrier 126 in some embodiments, for example. In some embodiments, a DAF or adhesive is applied to a bottom surface of the controller 102, and the controller 102 is then attached to the carrier 126. The controller 102 may comprise a die, multi-chip module, or microelectromechanical system (MEMS), as examples. The controller 102 has two or more contact pads 114 disposed on a surface thereof. The controller 102 may also comprise other types of devices. One or more capacitors 132, integrated passive devices (IPD's) 134, integrated circuit dies 148, inductors 150, or other types of components may also be attached to the carrier 126, for example (not shown: see FIG. 5).

Figure 15:
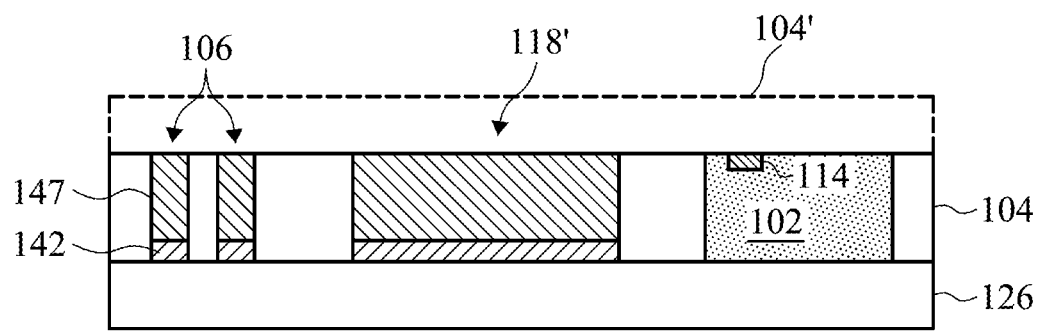

The molding material 104 is disposed over and around the through-vias 106, the winding 118' of the wireless charging coil 110, and the controller 102, as shown in FIG. 15. The molding material 104 is also disposed over and around any capacitors 132, IPD's 134, integrated circuit dies 148, inductors 150, or other types of components that may also be attached to the carrier 126. The molding material 104 is formed around the controller 102 and the second portion of the wireless charging coil 110 which comprises the winding 118' in some embodiments, for example. The molding material 104 may comprise a molding compound comprised of an insulating material, such as an epoxy, a filler material, a stress release agent (SRA), an adhesion promoter, other materials, or combinations thereof, as examples. The molding material 104 may comprise a liquid or gel when applied so that it flows between and around the through-vias 106, winding 118', controller 102, and other components, in some embodiments. The molding material 104 is then cured or allowed to dry so that it forms a solid. A molding compound clamp may be applied during a curing process and a plasma treatment process of the molding material 104 in some embodiments. In some embodiments, as deposited, the molding material 104 extends over top surfaces of the through-vias 106, windings 118', controller 102, (and other components, if present) as shown in phantom at 104' in FIG. 15. After the molding material 104 is applied, a top portion of the molding material 104 is removed using a planarization process, such as a chemical mechanical polish (CMP) process, a grinding process, an etch process, or combinations thereof, as examples. Other methods may also be used to planarize the molding material 104. A top portion of the through-vias 106, winding 118', and/or controller 102 (and/or other components, if present) may also be removed during the planarization process for the molding material 104. In some embodiments, an amount of the molding material 104 applied may be controlled so that top surfaces of the through-vias 106, winding 118', and controller 102 (and other components, if present) are exposed. Other methods may also be used to form the molding material 104.

Figure 16:
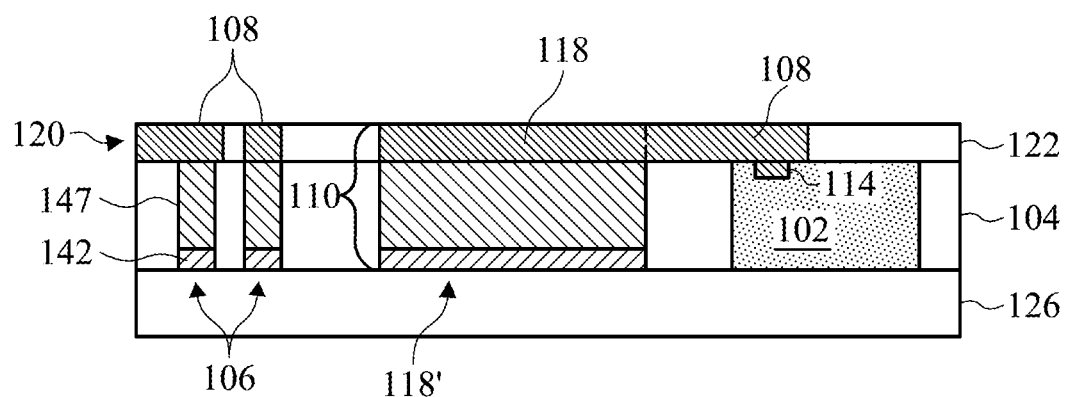

Next, a conductive material layer of the interconnect structure 120 and the first portion of the wireless charging coil 110 comprising the winding 118 are formed over the molding material 104 and the second portion of the wireless charging coil 110 in some embodiments. For example, the interconnect structure 120 may be formed over the planarized molding material 104, the through-vias 106, the winding 118', and the controller 102 (and other components, if present), as shown in FIG. 16. Conductive lines 108 of the conductive material layer of the interconnect structure 120 and the winding 118 may comprise similar materials as described for the through-vias 106 and winding 118', for example.

Figure 17:
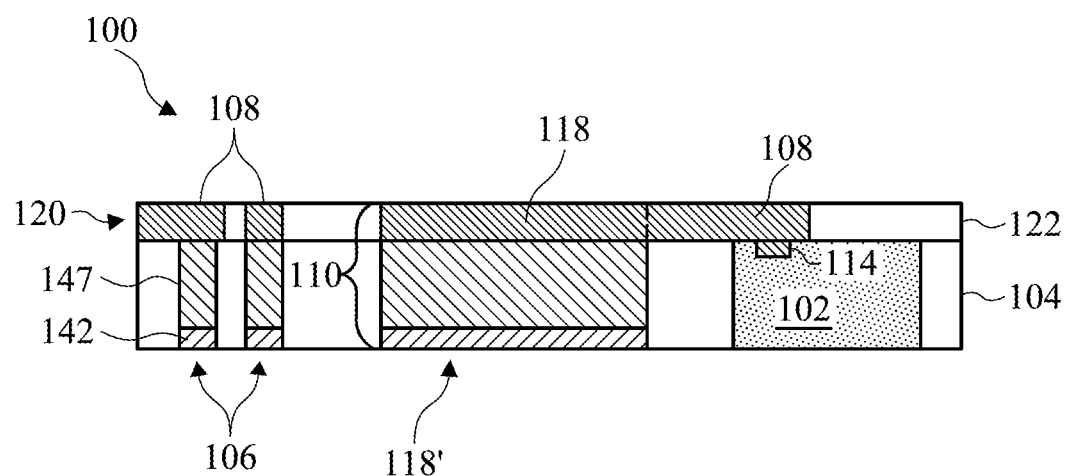

The interconnect structure 120 may comprise an RDL and/or a PPI in some embodiments. The interconnect structure 120 may include fan-out wiring wherein contact pads (not shown in FIG. 16 or 17; see contact pads 136 shown in FIG. 5) of the interconnect structure 120 are spaced out farther apart and have a larger footprint than contact pads 114 on the controller 102 and other components, if included. An interconnect structure 120 having only one conductive line layer is shown in FIGS. 16 and 17; however, the interconnect structure 120 may include one or more conductive line layer and one or more via layers. See also FIG. 2 wherein interconnect structures 120a and 120b each include two conductive line layers and one via layer, as an example. The interconnect structure 120 may also include a top-most layer that comprises an underball metallization (UBM) structure, for example, not shown. Some of the conductive lines 108 and/or conductive vias of the interconnect structure 120 are coupled to contact pads 114 of the controller 102.

In some embodiments, the conductive lines 108 and winding 118 of the wireless charging coil 110 are formed using a plating process. For example, a seed layer and sacrificial material may be formed as shown in and as described for FIG. 10, the sacrificial material may be patterned as shown in and as described for FIG. 11, and a conductive material may be plated over the seed layer through the patterned sacrificial material, as shown in and as described for FIG. 12. The sacrificial material and exposed seed layer are then removed, as shown in and described for FIGS. 13 and 14.

An insulating material 122 may then be formed around the conductive lines 108 and the winding 118, forming the interconnect structure 120, as shown in FIG. 16. The insulating material 122 may comprise a polymer, such as polybenzoxazole (PBO), polyimide, benzocyclobutene (BCB), or the like. In other embodiments, the insulating material 122 may comprise a nitride such as silicon nitride; an oxide such as silicon oxide, phosphosilicate glass (PSG), borosilicate glass (BSG), boron-doped phosphosilicate glass (BPSG); combinations or multiple layers thereof; or the like. The insulating material 122 may be formed by any acceptable deposition process, such as spin coating, chemical vapor deposition (CVD), laminating, the like, or a combination thereof.

The process described herein used to form the conductive line layer of the interconnect structure 120 may be repeated for additional via layers, conductive line layers, and UBM structures of the interconnect structure 120, if any are included. One or more additional metallization patterns with conductive lines, vias, and insulating material layers may be formed in the redistribution structure of the interconnect structure by repeating the processes described herein. Vias (see vias 124a and 124b shown in FIG. 2) may be formed during the formation of a conductive line pattern, e.g., in a dual damascene or plating process. The vias may interconnect and electrically couple the various conductive lines and other metallization patterns. The depiction of one conductive line layer in the interconnect structure 120 is for ease and simplicity of illustration.

In some embodiments, the insulating material 122 is deposited and patterned using a lithography process, and a seed layer (not shown) is formed over the patterned insulating material 122. A layer of photoresist is then deposited over the seed layer and is patterned using photolithography. A conductive material is plated over exposed portions of the seed layer through the patterned layer of photoresist. The layer of photoresist is removed, and exposed portions of the seed layer are removed, leaving the conductive lines 108 and the winding 118 formed within and over the insulating material 122, forming the interconnect structure 120.

In some embodiments, the conductive lines 108 and the winding 118 may be formed using a subtractive etch process, and the insulating material 122 is formed around the conductive lines 108 and the winding 118, forming the interconnect structure 120.

After the interconnect structure 120 is formed, the carrier 126 is then removed in some embodiments, as shown in FIG. 17. In some embodiments, a plurality of wireless charging devices 100 is formed simultaneously over the carrier 126, and the plurality of wireless charging devices 100 is singulated to form the wireless charging device 100 shown in FIG. 17. The plurality of wireless charging devices 100 may be singulated using a saw or laser (not shown), which may include a blade comprising diamond or other materials in some embodiments, for example.

In some embodiments, the windings 118 and 118' of the wireless charging coil 110 are formed using a metal foil stamping process. For example, in FIGS. 11 through 14, the through-vias 106 may be formed using a plating process, and the second portion of the wireless charging coil 110 comprising the winding 118' may be formed using a metal foil stamping process. The winding 118' is attached to the carrier 126 using an adhesive or an adhesive film (not shown), and the manufacturing process steps shown in and described for FIGS. 15 through 17 are performed. Likewise, the winding 118 may be formed using a metal foil stamping process and attached to the underlying winding 118', e.g., using a conductive adhesive or a conductive adhesive film.

One carrier 126 is used in the manufacturing process illustrated in FIGS. 10 through 17. One or more carriers 126, 126a, and/or 126b may be used to manufacture a wireless charging device or devices 100 in accordance with some embodiments. FIGS. 18 through 21 and FIGS. 22 through 27 illustrate manufacturing methods for wireless charging devices 100 wherein two carriers 126a and 126b are used, for example.

Figure 18:
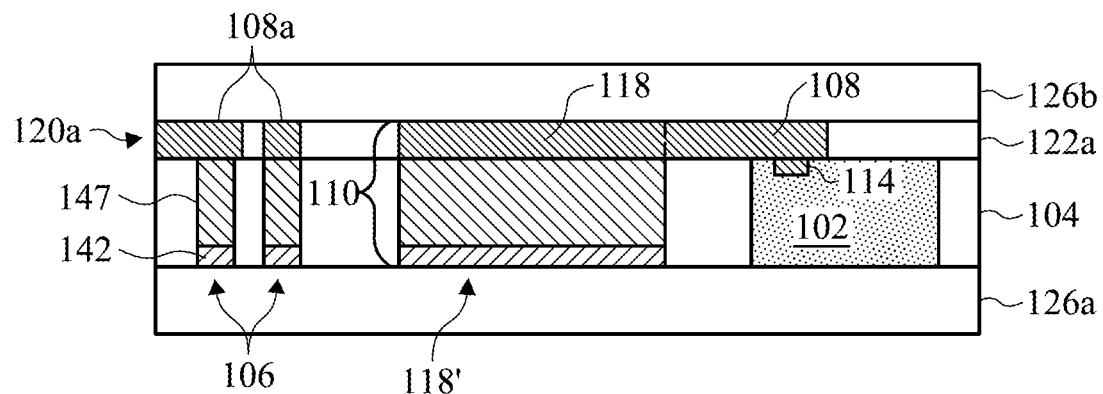
FIGS. 18 through 21 illustrate cross-sectional views of a method of manufacturing a wireless charging device at various stages of a manufacturing process in accordance with some embodiments.
Figure 19:
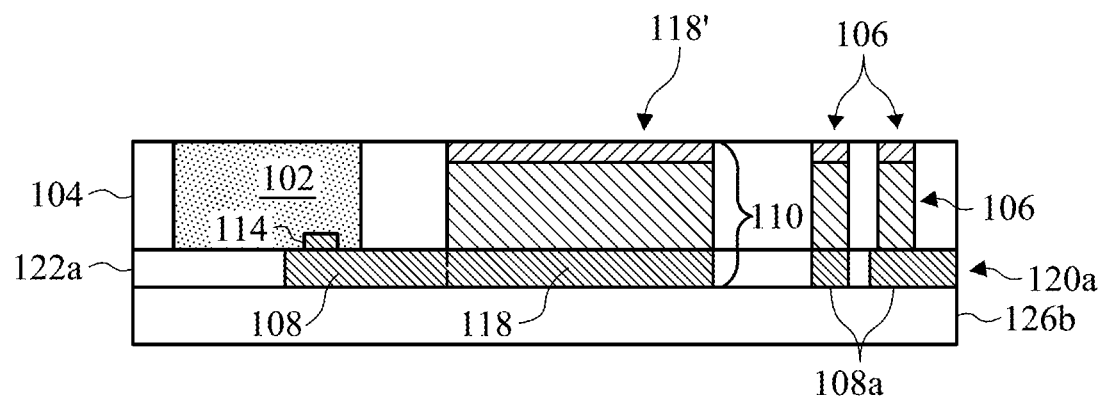

FIGS. 18 through 21 illustrate cross-sectional views of a method of manufacturing a wireless charging device 100 at various stages of a manufacturing process in accordance with some embodiments. The manufacturing process steps shown in and described for FIGS. 10 through 17 are performed over a first carrier 126a. A second carrier 126b comprising similar materials described for carrier 126 is provided and is coupled to the interconnect structure 120a, which is also referred to herein as a first interconnect structure 120a, as shown in FIG. 18. The first carrier 126a is removed, as shown in FIG. 19, and the device is inverted so that the side the first carrier 126a was attached to can be processed.

Figure 20:
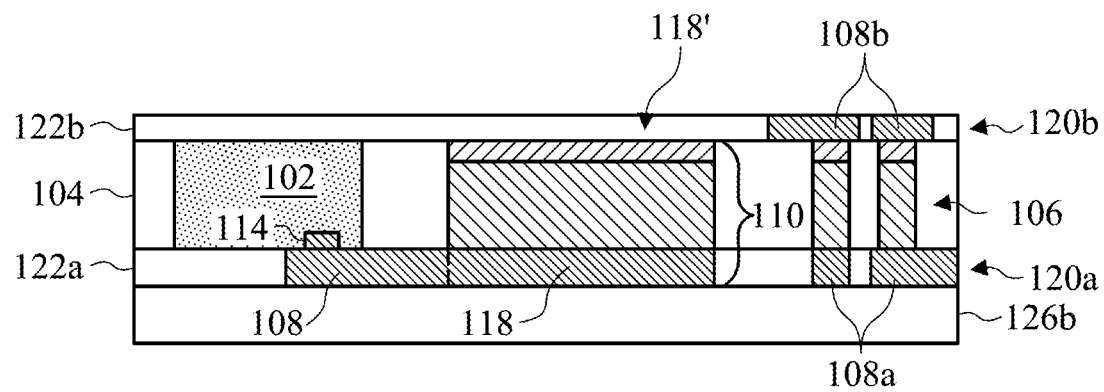
Figure 21:
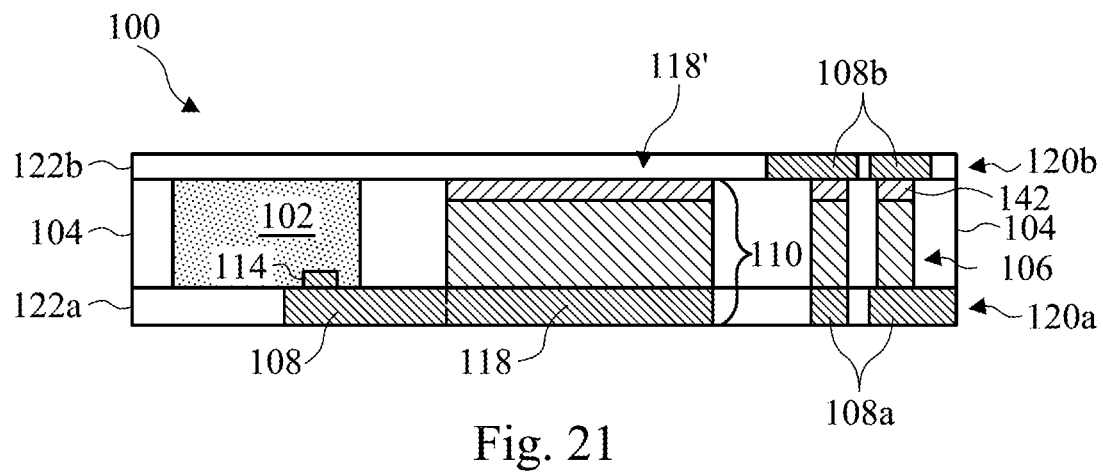

A second interconnect structure 120b is then formed over the molding material 104, the through-vias 106, the winding 118', and the controller 102 (and over other components disposed within the molding material 104, if included), as shown in FIG. 20. A conductive material layer of the second interconnect structure 120b is formed that includes a plurality of conductive lines 108b and insulating material 122b, which are formed using similar methods described for conductive lines 108 and insulating material 122. Some conductive lines 108b are coupled to through-vias 106 in some embodiments. The second carrier wafer 126b is then removed, as shown in FIG. 21.

Figure 22:
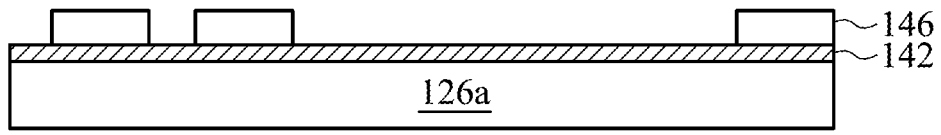
FIGS. 22 through 27 illustrate cross-sectional views of a method of manufacturing a wireless charging device at various stages in accordance with some embodiments.
Figure 23:
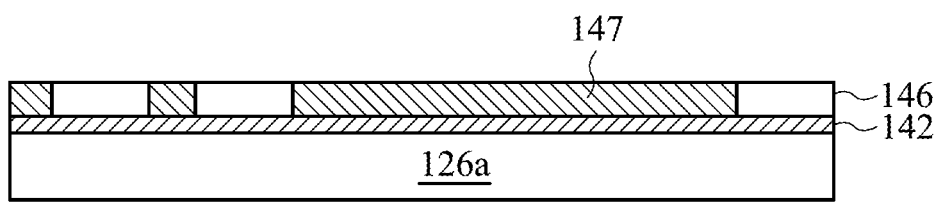
Figure 24:
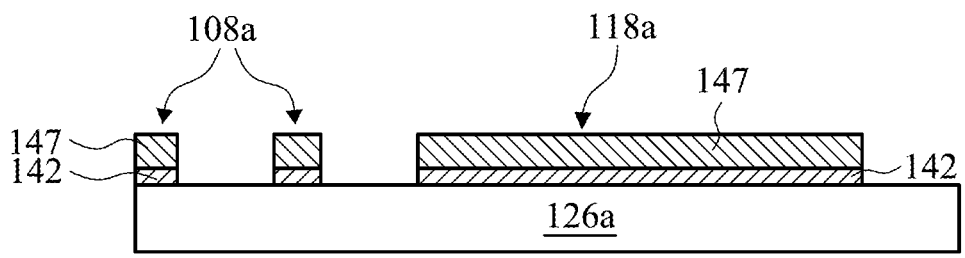
Figure 25:
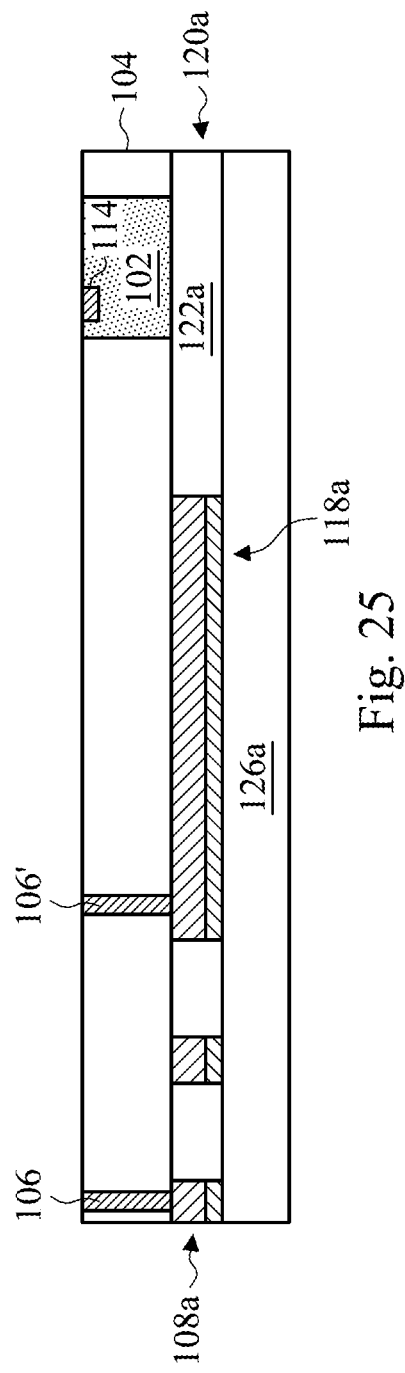

FIGS. 22 through 27 illustrate cross-sectional views of a method of manufacturing a wireless charging device 100 at various stages in accordance with some embodiments, wherein an interconnect structure 120a is formed first, before a molding material 104 layer is formed. A first carrier 126a is provided, and a seed layer 142 is formed over the first carrier 126a, as shown in FIG. 22. A sacrificial material 146 is formed over the seed layer 142 and is patterned using photolithography, also shown in FIG. 22. A conductive material 147 is plated onto the seed layer 142 through the patterned sacrificial material 146, as shown in FIG. 23. The sacrificial material 146 and exposed portions of the seed layer 142 that were covered by the sacrificial material 146 are removed, as shown in FIG. 24, forming conductive lines 108a and a first portion of the wireless charging coil 110 that comprises a winding 118a. The conductive lines 108a and the first portion of the wireless charging coil 110 are formed from the seed layer 142 and the conductive material 147. An insulating material 122a is then formed around the conductive lines 108a and the winding 118a, as shown in FIG. 25, forming a first interconnect structure 120a.

Through-vias 106 and 106' are plated over the first interconnect structure 120a, which is also shown in FIG. 25. A controller 102 and other components, in some embodiments, are formed over the first interconnect structure 120a, and a molding material 104 is formed around the through-vias 106 and 106', the controller 102, and the other components, if included.

Figure 26:
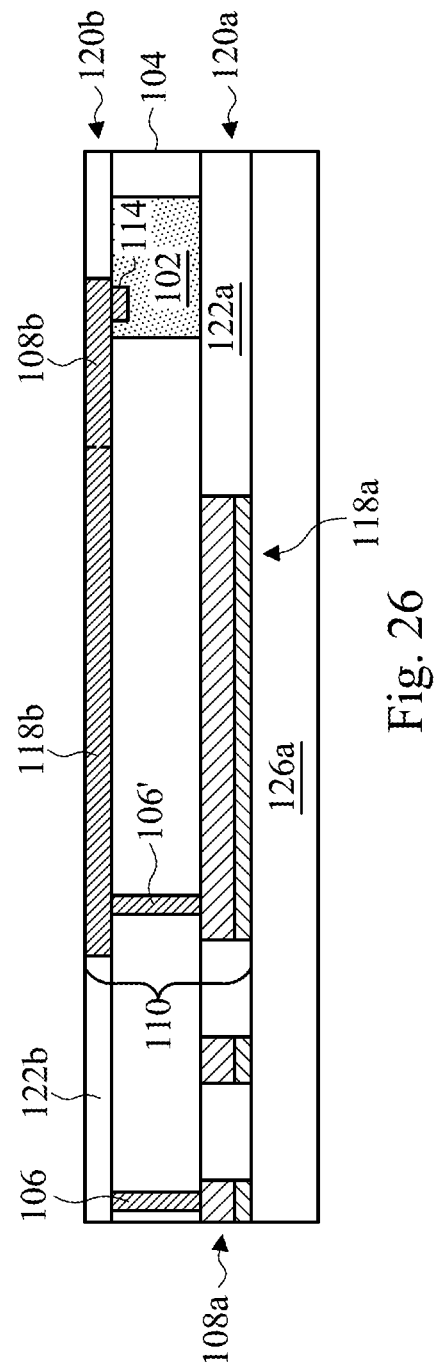
Figure 27:
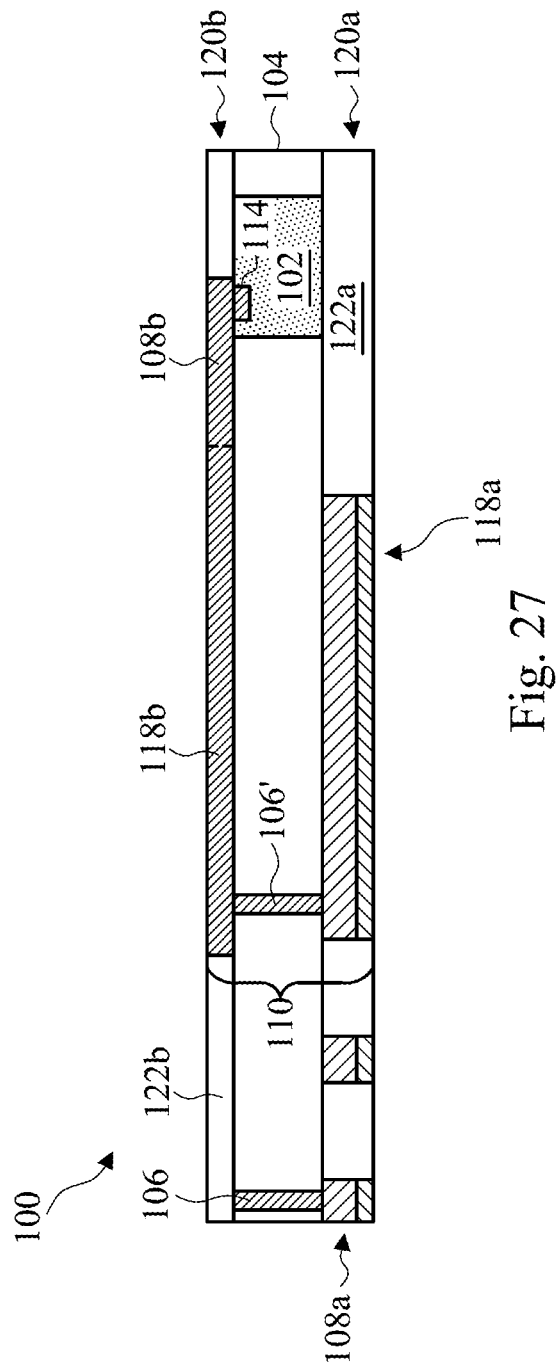

A second interconnect structure 120b may then be formed over the through-vias 106 and 106', the controller 102, other components (if included), and the molding material 104, as shown in FIG. 26. The conductive lines 108b and a third portion of the wireless charging coil 110 comprising a winding 118b are formed in a conductive line layer of the second interconnect structure 120b, for example. An insulating material 122b is formed around the conductive lines 108b and the winding 118b, forming the second interconnect structure 120b. The second carrier 126b is then removed, as shown in FIG. 27. In some embodiments, the second interconnect structure 120b is not included.

The windings 118a and 118b shown in FIGS. 24 through 27 may be formed by plating or by metal foil stamping in accordance with some embodiments. For example, in some embodiments, forming the first portion of the wireless charging coil 110 or forming the second portion of the wireless charging coil 110 may comprise a metal foil stamping process. Forming the wireless charging coil 110 may comprise coupling the first portion or the second portion to a carrier 126, 126a, or 126b or to an underlying material layer of the wireless charging device 100 using an adhesive or an adhesive film. The third portion of the wireless charging coil 110 may also comprise a metal foil stamping process, and forming the wireless charging coil 110 may comprise coupling the third portion to a carrier 126, 126a, or 126b or to an underlying material layer of the wireless charging device 100 using an adhesive or an adhesive film, in some embodiments.

Figure 28:
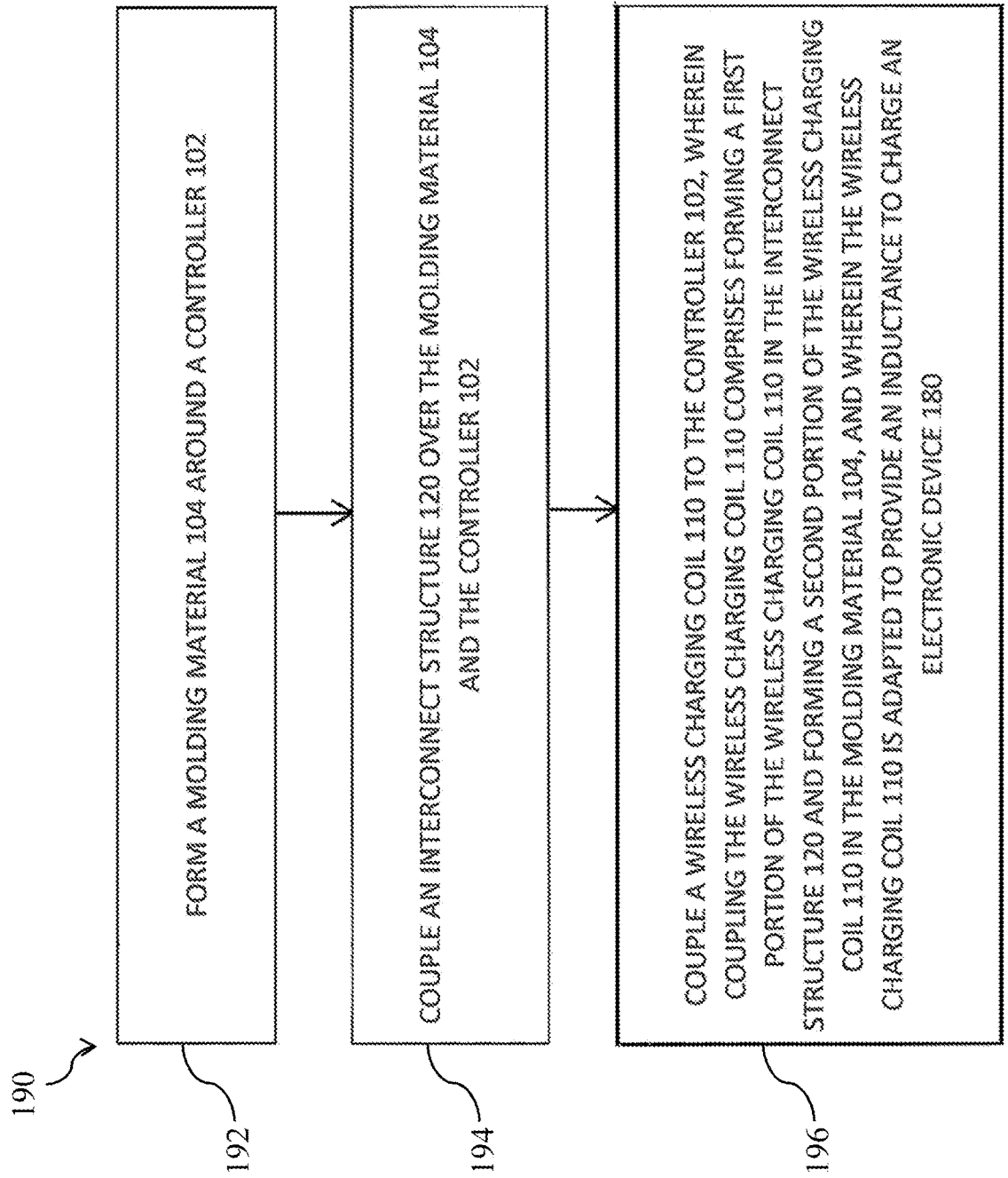
FIG. 28 is a flow chart that illustrates a method of manufacturing a wireless charging device in accordance with some embodiments of the present disclosure.

FIG. 28 is a flow chart 190 that illustrates a method of forming a wireless charging device 100 in accordance with some embodiments of the present disclosure. In step 192, a molding material 104 is formed around a controller 102. In step 194, an interconnect structure 120 is coupled over the molding material 104 and the controller 102. In step 196, a wireless charging coil 110 is coupled to the controller 102, wherein coupling the wireless charging coil 110 comprises forming a first portion of the wireless charging coil 110 in the interconnect structure 120 and forming a second portion of the wireless charging coil 110 in the molding material 104, and wherein the wireless charging coil 110 is adapted to provide an inductance to charge an electronic device 180.

Some embodiments of the present disclosure include methods of charging electronic devices 180. The methods may include providing a wireless charging device 100 comprising a controller 102, a molding material 104 disposed around the controller 102, an interconnect structure 120, 120a, or 120b disposed over the molding material 104 and the controller 102, and a wireless charging coil 110 coupled to the controller 102, the wireless charging coil 110 being disposed in the interconnect structure 120, 120a, or 120b and the molding material 104. The charging method for the electronic device 180 includes placing the wireless charging device 100 proximate the electronic device 180, and powering on the wireless charging device 100 (e.g., using the on/off button 162 or by plugging the power cord 164 coupled to a packaged wireless charging device 160 into an electrical outlet or socket). Powering on the wireless charging device 100 generates an inductance to charge the electronic device 180. In some embodiments, generating the inductance comprises inductive charging or resonance charging the electronic device, as examples. Other types of charging may also be used. Powering on the wireless charging device 100 generates an inductance of about 500 nano-Henries (nH) to about 2,000 nH in some embodiments, as examples. Other ranges of inductance may also be used.

Some embodiments of the present disclosure include wireless charging devices 100 that are formed using fan-out interconnect structures. Some embodiments include methods of forming the wireless charging devices 100. Some embodiments include methods of charging electronic devices.

Advantages of some embodiments of the present disclosure include providing wireless charging device designs and manufacturing methods thereof wherein wireless charging coils are embedded in structures that include highly integrated components formed therein. The wireless charging coils are formed in the same material layer as through-vias and interconnect structures. A controller for the wireless charging devices and other components is embedded within a molding compound wherein a portion of the wireless charging coil is also embedded. The wireless charging coils may have a symmetrical pitch and width without constraint of charging direction.

The wireless charging coils and devices have adjustable electrical characteristics such as resistance, inductance, and Q-factor. The wireless charging coils are highly integrated with other components within a wireless charging device.

The wireless charging coils may be scaled down in size for small applications, such as wearable devices and internet of things (IoT) devices, as examples. Wireless charging devices with a high Q-factor are achievable using the structures and methods described herein. The wireless charging devices may be manufactured such that they are small and easily portable in some embodiments, for example.

In some embodiments, a wireless charging device includes a controller, a molding material disposed around the controller, and an interconnect structure disposed over the molding material and the controller. The wireless charging device includes a wireless charging coil coupled to the controller. The wireless charging coil comprises a first portion disposed in the interconnect structure and a second portion disposed in the molding material. The wireless charging coil is adapted to provide an inductance to charge an electronic device.

In some embodiments, a method of manufacturing a wireless charging device includes forming a molding material around a controller, and coupling an interconnect structure over the molding material and the controller. The method includes coupling a wireless charging coil to the controller, wherein coupling the wireless charging coil comprises forming a first portion of the wireless charging coil in the interconnect structure and forming a second portion of the wireless charging coil in the molding material. The wireless charging coil is adapted to provide an inductance to charge an electronic device.

In some embodiments, a method of charging an electronic device includes providing a wireless charging device comprising a controller, a molding material disposed around the controller, an interconnect structure disposed over the molding material and the controller, and a wireless charging coil coupled to the controller, the wireless charging coil being disposed in the interconnect structure and the molding material. The method includes placing the wireless charging device proximate the electronic device, and powering on the wireless charging device. Powering on the wireless charging device generates an inductance to charge the electronic device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wireless charging device comprising:
    a controller;
    a molding material disposed around the controller, the molding material comprising a first surface level with a first surface of the controller, the molding material comprising a second surface opposite the first surface, the second surface of the molding material being level with a second surface of the controller;
    a first interconnect structure disposed on the first surface of the molding material, the first interconnect structure comprising a plurality of conductive lines and a first wireless charging coil;
    a through via extending through the molding material from the first surface to the second surface, the through via being electrically coupled to the first wireless charging coil; and
    a second interconnect structure disposed on the second surface of the molding material, the second interconnect structure comprising a second wireless charging coil, wherein the through via directly contacts the first wireless charging coil and the second wireless charging coil.

2. The wireless charging device according to claim 1, wherein the first wireless charging coil disposed in the first interconnect structure comprises a first winding comprising a shape of a rectangular spiral pattern.

3. The wireless charging device according to claim 1, wherein the second wireless charging coil disposed in the second interconnect structure comprises a second winding comprising a shape of a rectangular spiral pattern, and wherein the second winding is coupled to the through via.

4. The wireless charging device according to claim 1, further comprising an integrated passive device (IPD), a capacitor, an inductor, or an integrated circuit die disposed within the molding material or coupled to the first interconnect structure.

5. The wireless charging device according to claim 1, wherein the plurality of conductive lines is disposed around a perimeter of the wireless charging coil.

6. The wireless charging device according to claim 5, wherein the conductive lines of the plurality of conductive lines are coupled to peripheral through vias in the molding material.

7. The wireless charging device according to claim 1, wherein the through via electrically couples the first wireless charging coil to the second wireless charging coil and the second wireless charging coil electrically couples the through via to the controller.

8. A method of manufacturing a wireless charging device, the method comprising:
    forming a first interconnect structure over a carrier, the first interconnect structure comprising a first wireless charging coil;
    forming a through via over the first interconnect structure, the through via being connected to the first wireless charging coil;
    after forming the first interconnect structure and the through via, placing a controller over the first interconnect structure; and
    after forming the through via and placing the controller, forming a second interconnect structure over the controller and the through via, the second interconnect structure comprising a second wireless charging coil, the through via electrically coupling the first wireless charging coil to the second wireless charging coil, the second wireless charging coil electrically coupling the through via to the controller, the through via directly contacting the first wireless charging coil and the second wireless charging coil.

9. The method according to claim 8, wherein the first wireless charging coil comprises a first winding and the second wireless charging coil comprises a second winding.

10. The method according to claim 9, further comprising forming one or more additional devices over the first interconnect structure, the second interconnect structure being formed over the one or more additional devices, the one or more additional devices comprising a capacitor, an integrated passive device, an integrated circuit die or an inductor.

11. The method according to claim 10, further comprising forming a molding compound around the through via, the controller, and the one or more additional devices, the second interconnect structure being formed over the molding compound.

12. A method of manufacturing a wireless charging device, the method comprising:
   forming a first interconnect structure over a first carrier, wherein forming the first interconnect structure comprises:
   forming first conductive lines and a first wireless charging coil over the first carrier, wherein the first wireless charging coil is disposed entirely in the first interconnect structure;
   after forming the first interconnect structure, forming a through via over and coupled to the first interconnect structure;
   coupling a controller to the first interconnect structure;
   after forming the through via, forming a molding material around the controller and the through via;
   planarizing the molding material to expose a top surface of the controller and a top surface of the through via; and
   forming a second interconnect structure over the molding material and the controller, wherein the second interconnect structure comprises a second wireless charging coil, wherein a first end of the first wireless charging coil is coupled to a first contact pad of the controller, and wherein a second end of the first wireless charging coil is coupled to a second contact pad of the controller, wherein the second wireless charging coil directly contacts the through via, wherein the second wireless charging coil directly contacts the first contact pad or the second contact pad of the controller, wherein the second wireless charging coil is disposed entirely in the second interconnect structure, and wherein the second wireless charging coil is adapted to provide an inductance to charge an electronic device.

13. The method according to claim 12, wherein forming the through via comprises:
   forming a seed layer over the first interconnect structure;
   forming a sacrificial layer over the seed layer;
   patterning the sacrificial layer;
   plating the through via over the seed layer through the patterned sacrificial layer;
   removing the sacrificial layer; and
   removing the seed layer that was disposed beneath the sacrificial layer.

14. The method according to claim 12, wherein forming the second wireless charging coil comprises a metal foil stamping process, and wherein the method of manufacturing the wireless charging device further comprises coupling the second wireless charging coil or the through via to the first carrier or an underlying material layer of the wireless charging device using an adhesive or an adhesive film.

15. The method according to claim 12, further comprising removing the first carrier after forming the second interconnect structure over the molding material and the controller.

16. The method according to claim 12, wherein forming first the interconnect structure comprises:
   forming a seed layer over the first carrier;
   forming a sacrificial layer over the seed layer;
   patterning the sacrificial layer;
   plating the first conductive lines and the first wireless charging coil over the seed layer through the patterned sacrificial layer;
   removing the sacrificial layer;
   removing the seed layer that was disposed beneath the sacrificial layer; and
   forming an insulating material around the first conductive lines and the first wireless charging coil.

17. The method according to claim 16, wherein forming the second interconnect structure comprises:
   forming an additional seed layer over the controller, the molding material, and the through via;
   forming an additional sacrificial layer over the additional seed layer;
   patterning the additional sacrificial layer;
   plating the first wireless charging coil over the additional seed layer through the patterned additional sacrificial layer;
   removing the additional sacrificial layer;
   removing the additional seed layer that was disposed beneath the additional sacrificial layer; and
   forming an additional insulating material around the first wireless charging coil.

18. The method according to claim 17, wherein the first wireless charging coil comprises a first winding and the second wireless charging coil comprises a second winding.

19. The method according to claim 17, wherein the second wireless charging coil is electrically coupled to the through via and the through via is electrically coupled to the first wireless charging coil.

20. The method according to claim 16, further comprising placing an integrated passive device (IPD), a capacitor, an inductor, or an integrated circuit die over the insulating material before forming the molding material, wherein the molding material is formed around the integrated passive device (IPD), the capacitor, the inductor, or the integrated circuit die.

* * * * *